US006924545B2

(12) United States Patent
Uchimaru et al.

(10) Patent No.: US 6,924,545 B2
(45) Date of Patent: Aug. 2, 2005

(54) LOW-DIELECTRIC-CONSTANT INTERLAYER INSULATING FILM COMPOSED OF BORAZINE-SILICON-BASED POLYMER AND SEMICONDUCTOR DEVICE

(75) Inventors: Yuko Uchimaru, Tsukuba (JP); Masami Inoue, Tokyo (JP)

(73) Assignees: National Institute of Advanced Industrial Science, Tokyo (JP); Technology Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/093,406

(22) Filed: Mar. 11, 2002

(65) Prior Publication Data

US 2002/0142533 A1 Oct. 3, 2002

(30) Foreign Application Priority Data

Mar. 27, 2001 (JP) .................................. 2001-091460

(51) Int. Cl.$^7$ ...................... H01L 23/48; H01L 23/52; H01L 23/58; H01L 29/40; H01L 21/4763; H01L 21/31; H01L 21/469; C08G 79/08

(52) U.S. Cl. ...................... 257/642; 257/759; 438/623; 438/780; 438/781; 528/7

(58) Field of Search .......................... 528/7; 438/623, 438/781, 780; 257/642, 759

(56) References Cited

U.S. PATENT DOCUMENTS

| 5,098,865 A | * | 3/1992 | Machado et al. ........... 438/788 |
| 5,855,962 A | * | 1/1999 | Cote et al. ................ 427/376.2 |
| 2003/0100175 A1 | * | 5/2003 | Nobutoki et al. ........... 438/623 |

FOREIGN PATENT DOCUMENTS

| JP | 2000256466 A | * | 9/2000 | ........... F02D/29/02 |
| JP | 2000-340689 | | 12/2000 | |
| JP | 2000340689 A | * | 12/2000 | ........... H01L/23/08 |
| JP | 2001-015496 | | 1/2001 | |
| JP | 2001-015595 | | 1/2001 | |
| JP | 2002-155143 A | | 5/2002 | |
| JP | 2003-119289 A | | 4/2003 | |

OTHER PUBLICATIONS

Uchimaru, Yuko et al. "Synthesis and Thermal Properties of Organic–Inorganic Hybrid Polymers" Nippon Kagakkai Koen Yokoshu, 2000, vol. 78, No. 2, p. 682.*
Uchimaru Yuko et al., "Evaluation of Low–k Polymer Film Containing Borazine–unit" by Extended Abstracts (The 62nd Autumn Meeting, 2001); The Japan Society of Applied Physics and Related Societies, Sep. 11–14, 2001, p. 656.*
Uchimaru Yuko et al., "Evaluation of Low–k Polymer Film Containing Borazine–unit" by Extended Abstracts (The 48th Spring Meeting, 2001); The Japan Society of Applied Physics and Related Societies, Mar. 28–31, 2001, p. 877.*
"Evaluation of Low–k Polymer Film Containing Borazine-Unit", by U. Yuko et al., Extended Abstracts (The 48$^{th}$ Spring Meeting, 2001) ; The Japan Society of Applied Physics and Related Societies, Mar. 28–31, 2001, p. 877.
"Evaluation of Low–k Polymer Film Containing Borazine-Unit", by U. Yuko et al., Extended Abstracts (The 62nd Autumn Meeting, 2001) ; The Japan Society of Applied Physics and Related Societies, Sep. 11–14, 2001, p. 656.

* cited by examiner

*Primary Examiner*—Erik Kielin
(74) *Attorney, Agent, or Firm*—Birch, Stewart, Kolasch & Birch, LLP

(57) ABSTRACT

A low-dielectric-constant interlayer insulating film, which is composed of at least one selected from the group consisting of: (i) a low-dielectric-constant borazine-silicon-based polymer substance obtainable by reaction of, in the presence of a platinum catalyst, B,B',B"-triethynyl-N,N',N"-trimethylborazine with a specific silicon compound having at least two hydrosilyl groups; and (ii) a low-dielectric-constant borazine-silicon-based polymer substance obtainable by reaction of, in the presence of a platinum catalyst, B,B',B"-triethynyl-N,N',N"-trimethylborazine with a specific cyclic silicon compound having at least two hydrosilyl groups. A semiconductor device, which has the low-dielectric-constant interlayer insulating film. A low-refractive-index material, which is composed of the polymer substance (i) and/or (ii).

21 Claims, No Drawings

LOW-DIELECTRIC-CONSTANT INTERLAYER INSULATING FILM COMPOSED OF BORAZINE-SILICON-BASED POLYMER AND SEMICONDUCTOR DEVICE

FIELD OF THE INVENTION

The present invention relates to a low-dielectric-constant interlayer insulating film. The present invention also relates to a semiconductor device utilizing the low-dielectric-constant interlayer insulating film. Further, the present invention relates to a low-refractive-index material.

BACKGROUND OF THE INVENTION

At present, $SiO_2$ films (having a dielectric constant of k>4.0) obtained by vapor phase thin-film formation (chemical vapor deposition (CVD)) are used as interlayer insulating films of semiconductor devices. In addition, there are inorganic polymer materials typified by $SiO_2$-based SOG (spin on glass) materials and organic polymer materials typified by polyarylene ethers, as materials aimed at further lowering of the dielectric constant.

In a situation where ULSI having higher integration and higher operation speed are increasingly demanded, a gauge of wiring materials becomes small, wiring distance is increased and the number of layers in a wiring structure is increased in order to provide finer and highly-integrated chips. These cause increased wiring resistance and parasitic capacitance, which in turn cause signal delay which changes chip performance; therefore, it becomes important to solve these. To suppress signal delay from standpoints of a material and a process technology, it is indispensable to introduce low-resistance wiring materials and materials for an interlayer insulating film having a low dielectric constant. Accordingly, Cu wiring having lower resistance than that of conventional Al wiring and a low-dielectric-constant material as an interlayer insulating film are required.

Conventional interlayer insulating films made of $SiO_2$ films formed by vapor phase thin-film formation (CVD) have high dielectric constants; and therefore when further increasing integration and operation speed of ULSI parasitic capacitance which is a factor that causes signal delay, must be reduced. That is, lowering of the dielectric constant of the interlayer insulating films is required. In addition, since the metal in a wiring material diffuses into the insulating film, a problem arises that a barrier film must be provided in order to suppress the diffusion.

SUMMARY OF THE INVENTION

The present invention is a low-dielectric-constant interlayer insulating film, which comprises at least one selected from the group consisting of:

(i) a low-dielectric-constant borazine-silicon-based polymer substance obtainable by reaction of, in the presence of a platinum catalyst, B,B',B"-triethynyl-N,N',N"-trimethylborazine with a silicon compound having at least two hydrosilyl groups represented by formula (1):

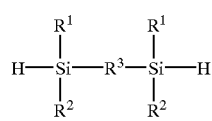
(1)

wherein, in the formula (1), $R^1$ and $R^2$, which may be the same or different, independently represent a monovalent group selected from the group consisting of an alkyl group, an aryl group, an aralkyl group, and a hydrogen atom; and $R^3$ represents a divalent aromatic group that may be optionally substituted by a substituent, an oxygen atom, or an oxypoly(dimethylsiloxy) group; and (ii) a low-dielectric-constant borazine-silicon-based polymer substance obtainable by reaction of, in the presence of a platinum catalyst, B,B',B"-triethynyl-N,N',N"-trimethylborazine with a cyclic silicon compound having at least two hydrosilyl groups represented by formula (2):

(2)

wherein, in the formula (2), $R^4$ represents an alkyl group, an aryl group or an aralkyl group, and ii is an integer of 3 or more.

Further, the present invention is a semiconductor device, which comprises an interlayer insulating film composed of the low-dielectric-constant borazine-silicon-based polymer substance (i) and/or (ii) as described above.

Further, the present invention is a low-refractive-index material, which comprises the low-dielectric-constant borazine-silicon-based polymer substance (i) and/or (ii) as described above.

Other and further features and advantages of the invention will appear more fully from the following description.

DETAILED DESCRIPTION OF THE INVENTION

According to the present invention, there is provided the following means:

(1) A low-dielectric-constant interlayer insulating film, comprising at least one selected from the group consisting of:

(i) a low-dielectric-constant borazine-silicon-based polymer substance obtainable by reaction of, in the presence of a platinum catalyst, B,B',B"-triethynyl-N,N',N"-trimethylborazine with a silicon compound having at least two hydrosilyl groups represented by formula (1):

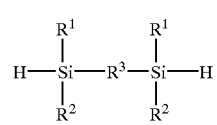
(1)

wherein, in the formula (1), $R^1$ and $R^2$, which may be the same or different, independently represent a monovalent group selected from the group consisting of an alkyl group, an aryl group, an aralkyl group, and a hydrogen atom; and $R^3$ represents a divalent aromatic group that may be optionally substituted by a substituent, an oxygen atom, or an oxypoly(dimethylsiloxy) group; and (ii) a low-dielectric-constant borazine-silicon-based polymer substance obtainable by reaction of, in the presence of a platinum catalyst, B,B',B"-triethynyl-N,N',N"-trimethylborazine with a cyclic silicon compound having at least two hydrosilyl groups represented by formula (2):

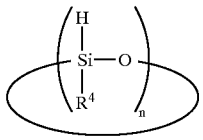

(2)

wherein, in the formula (2), $R^4$ represents an alkyl group, an aryl group or an aralkyl group, and n is an integer of 3 or more;

(2) A semiconductor device, comprising an interlayer insulating film composed of the low-dielectric-constant borazine-silicon-based polymer substance (i) and/or (ii) as described in the above item (1).

(3) The semiconductor device according to item (2), wherein the interlayer insulating film is composed of the low-dielectric-constant borazine-silicon-based polymer substance (i); and (4) The semiconductor device according to item (2), wherein the interlayer insulating film is composed of the low-dielectric-constant borazine-silicon polymer substance (ii).

(5) A low-refractive-index material, comprising the low-dielectric-constant borazine-silicon-based polymer substance (i) and/or (ii) as described in the above item (2).

The present invention will be described below.

The present inventors have found that, in lowering a dielectric constant of a material for interlayer insulating films, the borazine-silicon-based polymer substance having a specific structure obtainable by introducing a borazine ring unit into a main chain of a silicon-based polymer can achieve increase in thermal resistance and lowing of a dielectric constant of the resulting polymer.

The silicon compound having at least two hydrosilyl groups, which can be used in the present invention, is, for example, a compound represented by the formula (1).

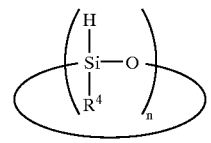

(1)

In the formula (1) above, $R^1$ and $R^2$, which may be the same or different, independently represent a monovalent group selected from the group consisting of an alkyl group, an aryl group, an aralkyl group and a hydrogen atom. The alkyl group has generally 1 to 24 carbon atoms, preferably 1 to 12 carbon atoms. The aryl group has generally 6 to 20 carbon atoms, preferably 6 to 10 carbon atoms. The aralkyl group has generally 7 to 24 carbon atoms, preferably 7 to 12 carbon atoms.

Examples of $R^1$ and $R^2$ above include alkyl groups, e.g. a methyl group, an ethyl group, an isopropyl group, a t-butyl group, and an octyl group; aryl groups, e.g. a phenyl group, a naphthyl group, and a biphenyl group; aralkyl groups, e.g. a henzyl group and a phenethyl group; a hydrogen atom; and the like.

Further, in the formula (1) above, $R^3$ represents a divalent aromatic group that may be optionally substituted by a substituent, an oxygen atom, or an oxypoly(dimethylsiloxy) group. The divalent aromatic group has generally 6 to 24 carbon atoms, preferably 6 to 12 carbon atoms. The divalent aromatic group includes divalent aromatic hydrocarbon groups (e.g. arylene groups), as well as arylene groups containing a hetero atom, such as oxygen atom, as a linking group, and the like. Examples of the substituent that may be optionally linked to the divalent aromatic group above include an alkyl group, an aryl group and an aralkyl group.

Examples of $R^3$ above include arylene groups, e.g. a phenylene group, a naphthylene group and a biphenylene group; substituted arylene groups, e.g. a diphenyl ether group; an oxygen atom; an oxypoly(dimethylsiloxy) group; and the like.

Silicon compounds having one or more substituent described above, and having one or at least two hydrosilyl groups, as represented by the formula (1) include bis (hydrosilane) compounds that include bis(monohydrosilane)s, bis(dihydrosilane)s, and bis(trihydrosilane)s. Specific examples of these bis(hydrosilane) compounds include m-bis(dimethylsilyl)benzene, p-bis(dimethylsilyl)benzene, 1,4-bis(dimethylsilyl)naphthalene, 1,5-bis(dimethylsilyl) naphthalene, m-bis(methylethylsilyl)benzene, m-bis (methylphenylsilyl)benzene, p-bis(methyloctylsilyl) benzene, 4,4'-bis(methylbenzylsilyl)biphenyl, 4,4'-bis (methylphenethylsilyl)diphenyl ether, m-bis(methylsilyl) benzene, m-disilylbenzene, 1,1,3,3-tetramethyl-1,3-disiloxane, hydrodimethylsiloxypoly(dimethylsiloxy) dimethylsilane, and the like. However, the present invention should not be limited thereto.

Further, in the present invention, the cyclic silicon compound having at least two hydrosilyl groups is, for example, those represented by the formula (2).

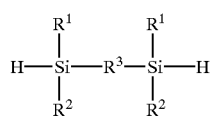

(2)

In the formula (2) above, $R^4$ represents an alkyl group, an aryl group. or an aralkyl group. The number of carbon atoms of the alkyl group is generally 1 to 24, preferably 1 to 12. The number of carbon atoms of the aryl group is generally 6 to 20, preferably 6 to 10. The number of carbon atoms of the aralkyl group is generally 7 to 24, preferably 7 to 12.

Examples of $R^4$ above include alkyl groups, e.g. a methyl group, an ethyl group, an isopropyl group, a t-butyl group, and an octyl group; aryl groups, e.g. a phenyl group, a naphthyl group, and a biphenyl group; aralkyl groups, e.g. a benzyl group and a phenethyl group; and the like. In addition, n is an integer of 3 or more, preferably 3 to 10, and more preferably 3 to 6.

Specific examples of the cyclic silicon compounds having at least two or more hydrosilyl groups include 1,3,5,7-tetramethylcyclotetrasiloxane, 1,3,5,7,9-pentamethylcyclopentasiloxane, 1,3,5,7-tetraethylcyclotetrasiloxane, 1,3,5,7-tetraphenylcyclotetrasiloxane, 1,3,5,7-tetrabenzylcyclotetrasiloxane, and the like. However, the present invention should not be limited thereto.

The silicon compound having two or more hydrosilyl groups can be used singly, but also use of two or more of the silicon compounds in combination is included in advantageous aspects of the present invention.

The cyclic silicon compound having two or more hydrosilyl groups can be used singly, but also use of two or more of the cyclic silicon compounds in combination is included in advantageous aspects of the present invention.

In the present invention, the molar ratio of the silicon compound represented by the formula (1) or (2) to 1 mole of B,B',B''-triethynyl-N,N',N''-trimethylborazine (hereinafter also referred to as "Compound A") is preferably 0.1 to 10, more preferably 0.3 to 3.

Reaction of Compound A and the compound represented by the formula (1) or (2), and a borazine-silicon-based polymer that can be obtained by the reaction are shown in the following Reaction Schemes.

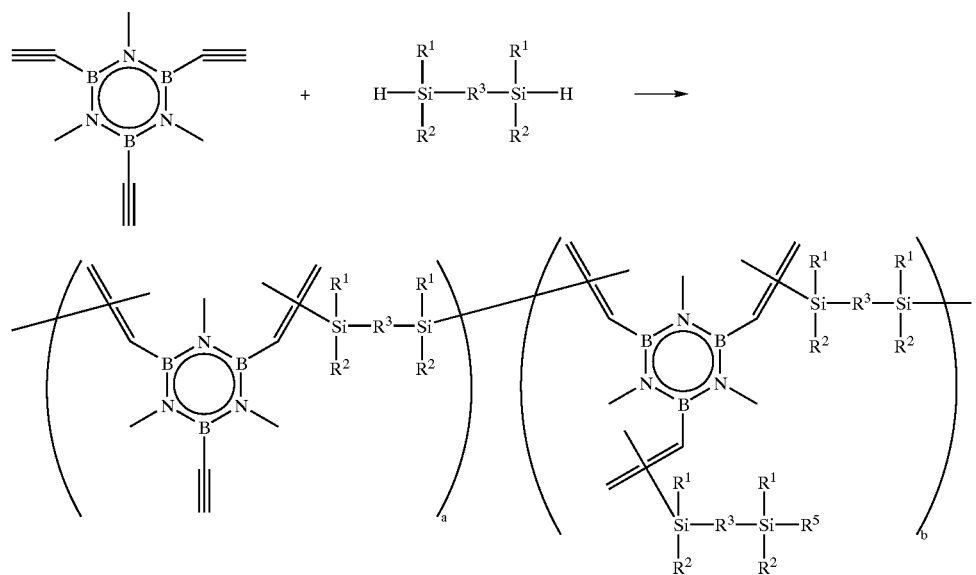

$R^5$=a terminal group composed of a monovalent organic group.

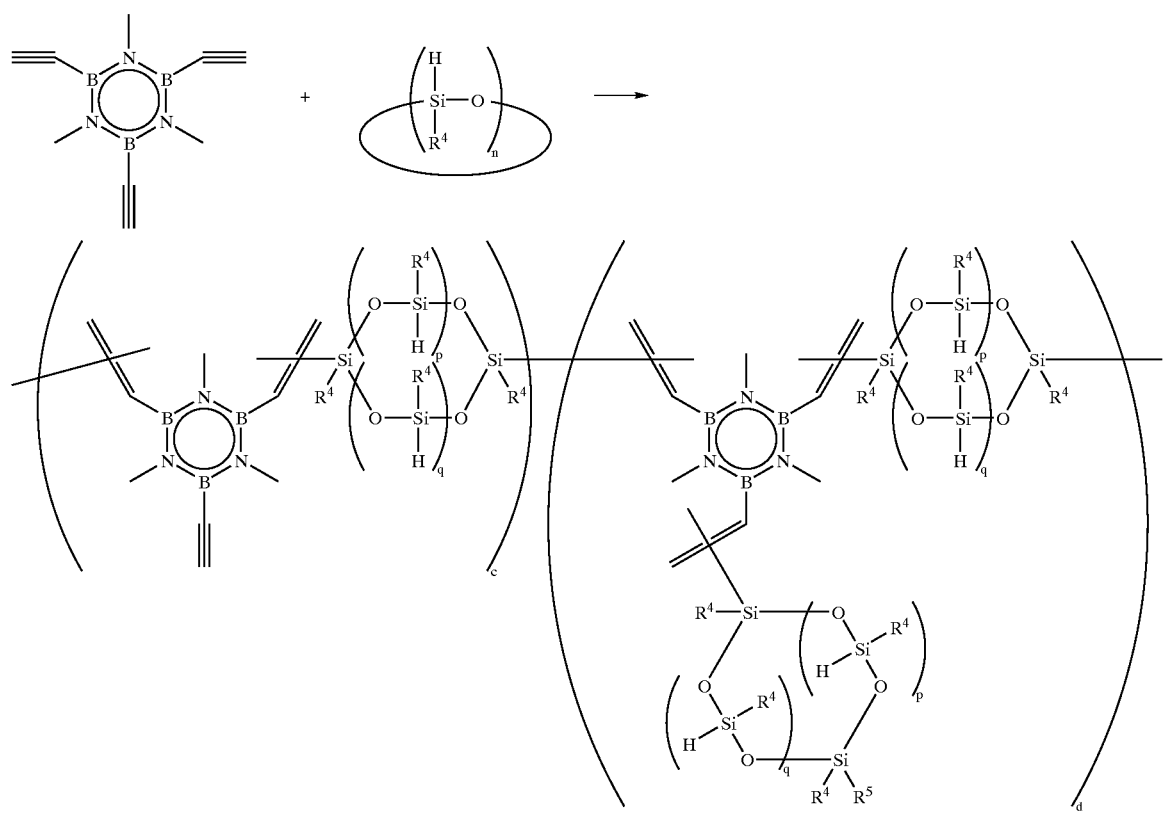

$R^5$=a terminal group composed of a monovalent organic group.

In the above formulae, $R^1$ to $R^4$ and n each have the same meanings as defined above; a and b are 0 or positive integers provided that both of them are not 0 (zero) simultaneously; c and d are 0 or positive integers provided that both of them are not 0 (zero) simultaneously; and p and q are 0 or positive integers.

The platinum catalyst that can be used in the present invention for preparing the borazine-silicon-based polymer includes, for example, Pt$_2$(dvs)$_3$, in which "dvs" represents 1,3-divinyl(1,1,3,3-tetramethyl-1,3-disiloxane).

The structure of these borazine-silicon-based polymers and the methods of producing them are described in detail in Japanese Patent No. 3041424 and Japanese Patent Application No. 2001-68771, the contents of which are incorporated herein by reference.

The borazine-silicon-based polymers obtained by the aforementioned reaction exhibit low dielectric constants and they can be used as interlayer insulating films constituting semiconductor devices, instead of using the conventionally known insulating material having low dielectric constants. Herein, the term "a low dielectric constant" means a dielectric constant of generally 4 to 1, preferably 3 to 1, as defined in "Jikken Kagaku Koza, Third Edition, Vol. 5, Kiso-Gijutu 4 Denki" published by Maruzen. In the present invention, the thickness of the interlayer insulating film is not limited particularly as far as the film has a sufficient thickness to provide a sufficient effect in various uses, for example, as an interlayer insulating film in a semiconductor device. Generally, the thickness of the interlayer insulating film is 0.04 to 2 μm, preferably 0.04 to 1 μm.

Further, the borazine-silicon-based polymers obtained by the aforementioned reaction also exhibit low refractive indexes, in addition to low dielectric constants, and they can be used in various optical applications, instead of using the conventionally known low-refractive-index materials. Herein, the term "a low refractive index" means a refractive index of generally 2 to 1, preferably 1.6 to 1.

The interlayer insulating film of the present invention has a low dielectric constant, as well as it is excellent in heat resistance, thermal conductivity and mechanical strength and it has a small thermal expansion coefficient and it can suppress diffusion of a metal of a wiring material into the insulating film.

The semiconductor device of the present invention can increase integration and operation speed of a resulting semiconductor device, by using the low-dielectric-constant interlayer insulating film.

The insulating film of the present invention composed of a silicon-based polymer having introduced therein a borazine ring unit, has a low dielectric constant and it is also excellent in thermal resistance.

Also, according to the present invention, use of a material having a low dielectric constant composed of a borazine-silicon-based polymer as an interlayer insulating film of a semiconductor device gives rise to the effect of reducing a parasitic capacity in the wiring structure of the semiconductor device.

Further, according to the present invention, wiring has a decreased parasitic capacity and use of such a wiring material is effective in increasing integration and operation speed of a resulting semiconductor device.

Further, the low-refractive-index material of the present invention composed of a silicon-based polymer having introduced therein a borazine ring unit, has a low refractive index, as well as the above-mentioned properties, and it is useful in applications as various optical elements.

Hereinafter, the present invention will be explained in more detail by way of the following examples, but the present invention should not be limited thereto.

EXAMPLES

Example 1

B,B',B"-triethynyl-N,N',N"-trimethylborazine (1 mole) and p-bis(dimethylsilyl)benzene (1 mole) were subjected to hydrosilylation polymerization, in an ethylbenzene solvent, under a nitrogen atmosphere, in the presence of a platinum catalyst (Pt$_2$(dvs)$_3$, in which dvs represents 1,3-divinyl(1,1, 3,3-tetramethyl-1,3-disiloxane), at 50° C. The amount of unreacted remaining monomers were monitored using gas chromatography. After performing about 2 hours' reaction, upon confirming that the remaining monomer content was 0%, the reaction was quenched. The reaction should be terminated before gelation is proceeded. The resulting solution of polycarbosilane having introduced therein a borazine unit taken out in a state of uniform solution was coated on a wafer by using a spin coater.

Then, the coated wafer (hereinafter also referred to as "sample") was heated at 200° C. for 1 hour and further at 300° C. for 30 minutes, in an electric furnace, under an argon gas atmosphere, to allow crosslinking reaction to proceed. The thin film thus obtained having a thickness of 0.3 μm was examined for the electrical characteristics and thermal characteristics. As a result, the value of the relative dielectric constant of 2.4 to 2.6 was obtained. The temperature at which a 5% weight loss occurred by heating under nitrogen was 563° C. The hardness of the thin film was 1.0 GPa, and the Young's modulus indicating elasticity of the thin film was 15 GPa.

Alternatively, the above sample was heated at 200° C. for 1 hour and then at 300° C. for 30 minutes, and further heated at 400° C. for 30 minutes, under an argon gas atmosphere. As a result, the value of relative dielectric constant of 2.2 to 2.4 was obtained. Alternatively, the above sample was heated at 200° C. for 1 hour and then at 300° C. for 30 minutes, and further heated at 500° C. for 30 minutes, under an argon gas atmosphere. As a result, the value of relative dielectric constant of 1.7 to 2.1 was obtained.

Example 2

B,B',B"-triethynyl-N,N',N"-trimethylborazine (1 mole) and 1,3,5,7-tetramethylcyclotetrasiloxane (1 mole) were subjected to hydrosilylation polymerization, in an ethylbenzene solvent, under a nitrogen atmosphere, in the presence of a platinum catalyst (Pt$_2$(dvs)$_3$, in which dvs represents 1,3-divinyl(1,1,3,3-tetramethyl-1,3-disiloxane), at 50° C. The amount of unreacted remaining monomers were monitored using gas chromatography. After performing about 2 hours' reaction, upon confirming that the remaining monomer content was 0%, the reaction was terminated. The reaction should be terminated before gelation is proceeded. The resulting solution of polysiloxane having introduced therein a borazine unit taken out in a state of uniform solution was coated on a wafer by using a spin coater. The coated wafer was heated at 200° C. for 1 hour and then at 300° C. for 30 minutes, in an electric furnace, under an argon gas atmosphere, to allow crosslinking reaction to proceed. The thin film thus obtained having a thickness of 0.3 μm was examined for the electrical characteristics and thermal characteristics. As a result, the value of the relative dielectric constant of 2.8 was obtained. The temperature at which a 5% weight loss occurred by heating under nitrogen was 564° C. The refractive index of the thin film was measured based on the ellipsometry, in the range of the wavelength of 250 nm to 830 nm. As a result, with respect to the wavelength of 633 nm, the obtained refractive index was 1.46.

Having described our invention as related to the present embodiments, it is our intention that the invention not be limited by any of the details of the description, unless otherwise specified, but rather be construed broadly within its spirit and scope as set out in the accompanying claims.

What we claim is:

1. A low-dielectric-constant interlayer insulating film, comprising at least one borazine-silicon-based polymer substance selected from the group consisting of:
   (i) a borazine-silicon-based polymer substance obtainable by reaction of, in the presence of a platinum catalyst, B,B',B"-triethynyl-N,N',N"-trimethylborazine with a silicon compound having at least two hydrosilyl groups represented by formula (1);

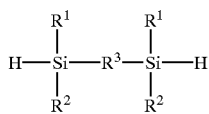
(1)

wherein, in the formula (1), $R^1$ and $R^2$, which may be the same or different, independently represent a monovalent group selected from the group consisting of an alkyl group, an aryl group, an aralkyl group, and a hydrogen atom; and $R^3$ represents a divalent aromatic group that may be optionally substituted by a substituent, an oxygen atom, or an oxypoly(dimethylsiloxy) group; and (ii) a borazine-silicon-based polymer substance obtainable by reaction of, in the presence of a platinum catalyst, B,B',B"-triethynyl-N,N',N"-trimethylborazine with a cyclic silicon compound having at least two hydrosilyl groups represented by formula (2):

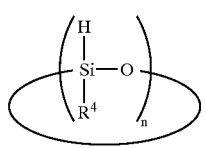
(2)

wherein, in the formula (2), $R^4$ represents an alkyl group, an aryl group or an aralkyl group; and n is an integer of 3 or more, wherein the low-dielectric-constant interlayer insulating film is obtained by providing a film of the borazine-silicon-based polymer substance (i) or (ii), heating the film at a temperature of 200° C. or lower, and further heating at a temperature of higher than 200° C. to 500° C. to cause crosslinking to form the low-dielectric-constant interlayer insulating film.

2. The low-dielectric-constant interlayer insulating film according to claim 1, which is comprised of the borazine-silicon-based polymer substance (i).

3. The low-dielectric-constant interlayer insulating film according to claim 1, wherein $R^1$ and $R^2$ in the formula (1) independently represent a methyl group, an ethyl group, an isopropyl group, a t-butyl group, an octyl group, a phenyl group, a naphthyl group, a biphenyl group, a benzyl group, a phenethyl group, or a hydrogen atom.

4. The low-dielectric-constant interlayer insulating film according to claim 1, wherein $R^3$ in the formula (1) represents a phenylene group, a naphthylene group, a biphenylene group, a diphenyl ether group, an oxygen atom, or an oxypoly(dimethylsiloxy) group.

5. The low-dielectric-constant interlayer insulating film according to claim 1, wherein the silicon compound having at least two hydrosilyl groups represented by formula (1) is at least one compound selected from the group consisting of bis(monohydrosilane)s, bis(dihydrosilane)s, and bis(trihydrosilane)s.

6. The low-dielectric-constant interlayer insulating film according to claim 1, wherein the silicon compound having at least two hydrosilyl groups represented by formula (1) is at least one compound selected from the group consisting of m-bis(dimethylsilyl)benzene, p-bis(dimethylsilyl)benzene, 1,4-bis(dimethylsilyl)naphthalene, 1,5-bis(dimethylsilyl)naphthalene, m-bis(methylethylsilyl)benzene, m-bis(methylphenylsilyl)benzene, p-bis(methyloctylsilyl)benzene, 4,4'-bis(methylbenzylsilyl)biphenyl, 4,4'-bis(methylphenethylsilyl)diphenyl ether, m-bis(methylsilyl)benzene, m-disilylbenzene, 1,1,3,3-tetramethyl-1,3-disiloxane, and hydrodimethylsiloxypoly(dimethylsiloxy)dimethylsilane.

7. The low-dielectric-constant interlayer insulating film according to claim 1, wherein a molar ratio of the silicon compound having at least two hydrosilyl groups represented by formula (1) to 1 mole of B,B',B"-triethynyl-N,N',N"-trimethylborazine is 0.1 to 10.

8. The low-dielectric-constant interlayer insulating film according to claim 1, which is comprised of the borazine-silicon-based polymer substance (ii).

9. The low-dielectric-constant interlayer insulating film according to claim 1, wherein $R^4$ in the formula (2) above represents a methyl group, an ethyl group, an isopropyl group, a t-butyl group, an octyl group, a phenyl group, a naphthyl group, a biphenyl group, a benzyl group, or a phenethyl group.

10. The low-dielectric-constant interlayer insulating film according to claim 1, wherein n in the formula (2) is 3 to 10.

11. The low-dielectric-constant interlayer insulating film according to claim 1, wherein the cyclic silicon compound having at least two hydrosilyl groups represented by formula (2) is at least one compound selected from the group consisting of 1,3,5,7-tetramethylcyclotetrasiloxane, 1,3,5,7,9-pentamethylcyclopentasiloxane, 1,3,5,7-tetraethylcyclotetrasiloxane, 1,3,5,7-tetraphenylcyclotetrasiloxane, and 1,3,5,7-tetrabenzylcyclotetrasiloxane.

12. The low-dielectric-constant interlayer insulating film according to claim 1, wherein a molar ratio of the cyclic silicon compound having at least two hydrosilyl groups represented by the formula (2) to 1 mole of B,B',B"-triethynyl-N,N',N"-trimethylborazine is 0.1 to 10.

13. The low-dielectric-constant interlayer insulating film according to claim 1, wherein the platinum catalyst is $Pt_2(dvs)_3$, in which "dvs" represents 1,3-divinyl(1,1,3,3-tetramethyl-1,3-disiloxane).

14. The insulating film according to claim 1, wherein the interlayer insulating film has a thickness of 0.04 to 2 µm.

15. A semiconductor device, comprising a low-dielectric-constant interlayer insulating film, wherein the interlayer insulating film is composed of at least one borazine-silicon-based polymer substance selected from the group consisting of:

(i) a borazine-silicon-based polymer substance obtainable by reaction of, in the presence of a platinum catalyst, B,B',B"-triethynyl-N,N',N"-trimethylborazine with a silicon compound having at least two hydrosilyl groups represented by formula (1):

(1)

wherein, in the formula (1), $R^1$ and $R^2$, which may be the same or different, independently represent a monovalent group selected from the group consisting of an alkyl group, an aryl group, an aralkyl group, and a hydrogen atom; and $R^3$ represents a divalent aromatic group that may be optionally substituted by a substituent, an oxygen atom, or an oxypoly(dimethylsiloxy) group; and (ii) a borazine-silicon-based polymer substance obtainable by reaction of, in the presence of a platinum catalyst, B,B',B"-triethynyl-N,N',N"-trimethylborazine with a cyclic silicon compound having at least two hydrosilyl groups represented by formula (2):

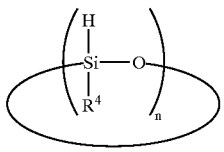

wherein, in the formula (2), $R^4$ represents an alkyl group, an aryl group or an aralkyl group; and n is an integer of 3 or more, wherein the interlayer insulating film is obtained by providing a film of the borazine-silicon-based polymer substance (i) or (ii), heating the film at a temperature of 200° C. or lower, and further heating at a temperature of higher than 200° C. to 500° C. to cause crosslinking to form the low-dielectric-constant interlayer insulating film.

16. The semiconductor device according to claim 15, wherein the interlayer insulating film is composed of the borazine-silicon-based polymer substance (i).

17. The semiconductor device according to claim 15, wherein the interlayer insulating film is composed of the borazine-silicon-based polymer substance (ii).

18. The semiconductor device according to claim 15, wherein the interlayer insulating film has a thickness of from 0.04 to 2 μm.

19. A low-dielectric-constant interlayer insulating film, comprising at least one borazine-silicon-based polymer substance selected from the group consisting of:
(i) a borazine-silicon-based polymer substance obtainable by reaction of, in the presence of a platinum catalyst, B,B',B''-triethynyl-N,N',N''-trimethylborazine with a silicon compound having at least two hydrosilyl groups represented by formula (1):

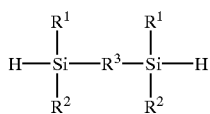

wherein, in the formula (1), $R^1$ and $R^2$, which may be the same or different, independently represent a monovalent group selected from the group consisting of an alkyl group, an aryl group, an aralkyl group, and a hydrogen atom; and $R^3$ represents a divalent aromatic group that may be optionally substituted by a substituent, an oxygen atom, or an oxypoly(dimethylsiloxy) group; and (ii) a borazine-silicon-based polymer substance obtainable by reaction of, in the presence of a platinum catalyst, B,B',B''-triethynyl-N,N',N''-trimethylborazine with a cyclic silicon compound having at least two hydrosilyl groups represented by formula (2):

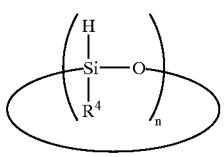

wherein, in the formula (2), $R^4$ represents an alkyl group, an aryl group or an aralkyl group; and n is an integer of 3 or more, and wherein the low-dielectric-constant interlayer insulating film is composed of a crosslinked polymer of said borazine-silicon-based polymer substance having a dielectric constant of 4 to 1, and wherein the low-refractive-index material is obtained by providing a film of the borazine-silicon-based polymer substance (i) or (ii), heating the film at a temperature of 200° C. or lower, and further heating at a temperature of higher than 200° C. to 500° C. to cause crosslinking to form the low-dielectric-constant interlayer insulating film.

20. The low-dielectric-constant interlayer insulating film according to claim 19, wherein the insulating film has a thickness of 0.04 to 2 μm.

21. An interlayer, which comprises:
a wafer; and
a low-dielectric-constant insulating film over the wafer, said insulating film comprising at least one borazine-silicon-based polymer substance selected from the group consisting of:
(i) a borazine-silicon-based polymer substance obtainable by reaction of, in the presence of a platinum catalyst, B,B',B''-triethynyl-N,N',N''-trimethylborazine with a silicon compound having at least two hydrosilyl groups represented by formula (1):

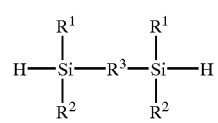

wherein, in the formula (1), $R^1$ and $R^2$, which may be the same or different, independently represent a monovalent group selected from the group consisting of an alkyl group, an aryl group, an aralkyl group, and a hydrogen atom; and $R^3$ represents a divalent aromatic group that may be optionally substituted by a substituent, an oxygen atom, or an oxypoly(dimethylsiloxy) group; and (ii) a borazine-silicon-based polymer substance obtainable by reaction of, in the presence of a platinum catalyst, B,B',B''-triethynyl-N,N',N''-trimethylborazine with a cyclic silicon compound having at least two hydrosilyl groups represented by formula (2):

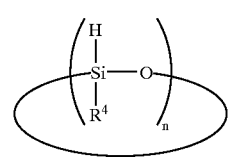

wherein, in the formula (2), $R^4$ represents an alkyl group, an aryl group or an aralkyl group; and n is an integer of 3 or more, wherein the low-dielectric-constant interlayer insulating film is obtained by providing a film of the borazine-silicon-based polymer substance (i) or (ii), heating the film at a temperature of 200° C. or lower, and further heating at a temperature of higher than 200° C. to 500 ° C. to allow crosslinking for form the low-dielectric-constant insulating film.

* * * * *